United States Patent [19]

Sato

[11] 4,313,090
[45] Jan. 26, 1982

[54] CAR-MOUNTED AUDIO EQUIPMENT

[75] Inventor: Reisuke Sato, Kawagoe, Japan

[73] Assignee: Pioneer Electronic Corporation, Tokyo, Japan

[21] Appl. No.: 138,634

[22] Filed: Apr. 8, 1980

[30] Foreign Application Priority Data

Apr. 11, 1979 [JP] Japan .................. 54-48058[U]

[51] Int. Cl.³ .................. H03F 1/26; H03F 3/68
[52] U.S. Cl. .................. 330/149; 330/124 R; 330/296
[58] Field of Search .......... 330/295, 296, 149, 124 R

[56] References Cited
FOREIGN PATENT DOCUMENTS
2347733 4/1974 Fed. Rep. of Germany ...... 330/295

Primary Examiner—James B. Mullins
Assistant Examiner—Gene Wan
Attorney, Agent, or Firm—Sughrue, Mion, Zinn, Macpeak and Seas

[57] ABSTRACT

A car-mounted audio equipment of multiamplifier system including a single preamplifier, a plurality of power amplifiers and the corresponding number of differential amplifiers each connected between an output terminal of the preamplifier and an input terminal of each of the power amplifiers comprises a biasing means for biasing at least one of the ground terminals of the power amplifiers to a potential substantially equal to the ground potential when the one terminal is in an open state.

3 Claims, 3 Drawing Figures

AUTOMOBILE BODY

AUTOMOBILE BODY

AUTOMOBILE BODY

CAR-MOUNTED AUDIO EQUIPMENT

BACKGROUND OF THE INVENTION

The present invention relates to an audio device such as a component car stereo to be mounted on an automobile and, more particularly, to an audio device of the multi-amplifier system in which an output of a single preamplifier is connected to inputs of a plurality of main amplifiers.

In the conventional car mounted audio device, a car battery is used for a power source thereof. Therefore, when the multi-amplifier system where a single preamplifier drives a pair of power amplifiers is employed, input side grounded points of the main amplifiers are commonly connected in the preamplifier and form a grounding loop as shown in FIG. 1. Therefore, noise component overlapped on the power source due to the loop, i.e., noises and ripple components of signal generated by the car, will be supplied to the input terminals of the power amplifiers. As a result, the noise component is amplified by the main amplifiers. In FIG. 1, an output signal $e_i$ of the preamplifier A which is included in a musical source such as a cassette deck or radio tuner mounted on the car is supplied to input terminals $I_1$ and $I_2$ of a pair of the power amplifiers $B_1$ and $B_2$ which are provided separately from the musical source. Output terminals $O_1$ and $O_2$ of the respective power amplifiers $B_1$ and $B_2$ are connected to a pair of loud speakers $SP_1$ and $SP_2$ to drive the latter. The above circuit construction forms the so-called multi-system. In this case, when the physical distance between preamplifier A and the power amplifier $B_2$, for example, in considerable, there is provided an impendance in a path extending between a grounding terminal $E_A$ of the preamplifier and a grounding terminal $E_2$ of the power amplifier $B_2$, through which currents caused by noises of an alternator, an ignition system and a horn of the car will flow. As a result, an equivalent noise signal $e_n$ is apparently inserted in series with the output signal $e_i$ of the preamplifier A between the signal output terminal $O_A$ of the preamplifier A and the input terminal $I_2$ of the power amplifier $B_2$, which is amplified by the power amplifiers to drive the loud speakers.

Furthermore, since a portion of main currents of the power amplifiers will flow through the grounding circuit, a ripple voltage is also inserted in series between the output terminal $O_A$ of the preamplifier A and the input terminal $I_2$ of the power amplifier $B_2$, causing the Klirr factor to be degraded.

In order to overcome these problems, it has been proposed to insert a line transformer between the preamplifier A and the power amplifier $B_2$ to cut the grounding loop circuit. However, the line transformer is generally heavy and bulkey and the line transformer having good high frequency characteristics is very expensive. The number of the line transformers must be increased if two or more power amplifiers are to be used.

In order to resolve the problems inherent to the use of the line transformer, a circuit shown in FIG. 2 has been proposed. In FIG. 2, the output signal $e_i$ of the signal preamplifier A is applied through a pair of variable feder resistors $R_1$ and $R_2$ to differential inputs of a pair of differential amplifiers $D_1$ and $D_2$ which function to cut the grounding circuit, respectively. That is, the signal output terminal $O_A$ of the preamplifier A is connected through the variable feder resistors $R_1$ and $R_2$ to forward phase input terminals of the differential amplifiers $D_1$ and $D_2$, respectively. The output terminals of the differential amplifiers are connected to the input terminals $I_1$ and $I_2$ of the power amplifiers $B_1$ and $B_2$, respectively, and the grounding terminal $E_A$ of the preamplifier A is connected to reverse phase input terminals of the differential amplifiers $D_1$ and $D_2$. The output terminals of the differential amplifiers are connected to the input terminals $I_1$ and $I_2$ of the power amplifiers $B_1$ and $B_2$. Grounding terminals $E_{D1}$ and $E_{D2}$ (which are common) of the differential amplifiers are connected to the grounding terminals $E_1$ and $E_2$ of the power amplifiers $B_1$ and $B_2$, respectively. Other components and connections therebetween in FIG. 2 are the same as those shown in FIG. 1. This circuit construction is very effective in the sence of removing the aforementioned problem.

In the circuit shown in FIG. 2, the noise voltage $e_n$ produced between the terminals $E_A$ and $E_2$ is added directly between the reverse input terminal of the differential amplifier $D_2$ and the grounding terminal (common terminal) $E_{D2}$ of the same. On the other hand, to the non-reverse input terminal thereof, a signal $e_i + e_n$ where $e_n$ is the noise voltage and $e_i'$ is a feder-controlled voltage of the output signal voltage $e_i$ of the preamplifier A is applied. Since, in this case, the signals $e_n$ and $e_i' + e_n$ are in phase, a signal $K(e_i' + e_n - e_n) = K.e_i'$ appears at the output of the differential amplifier $D_2$, where K is an amplification factor of the differential amplifier $D_2$.

Therefore, the noise voltage $e_n$ is completely removed by the differential amplifier $D_2$. This is also applicable to the other differential amplifier $D_1$.

Therefore, a signal corresponding only to the output signal $e_i$ of the preamplifier A is fed to the power amplifiers $B_1$ and $B_2$ and it is possible to drive the loud speakers $SP_1$ and $SP_2$ connected as a load, without noise.

However, there are cases where only one of the power amplifiers $B_1$ and $B_2$ is to be used according to demand of a user. In such case, the output of one of the differential amplifiers, say $D_2$, becomes in an open state and thus the grounding terminal $E_{D2}$ thereof becomes in the floating state.

With the circuit construction in which the car battery voltage V is directly applied to the positive power supply line of the differential amplifier $D_2$, the floating condition of the grounding terminal $E_{D2}$ may provide sources of undesirable noises affecting the whole circuit system through loops passing from the power supply line through internal circuit elements, the differential input thereof and the input terminal of the differential amplifier $D_2$.

SUMMARY OF THE INVENTION

An object of the present invention is to resolve the problem caused by the floating condition of the grounding terminal of either of the differential amplifiers of the car-mounted multistereo system, with an addition of a single circuit thereto.

According to the present invention, the above object is achieved by providing a biasing circuit which functions to bias the floating grounding terminal to a grounding potential.

DETAILED DESCRIPTION OF THE EMBODIMENT

Figure 1:
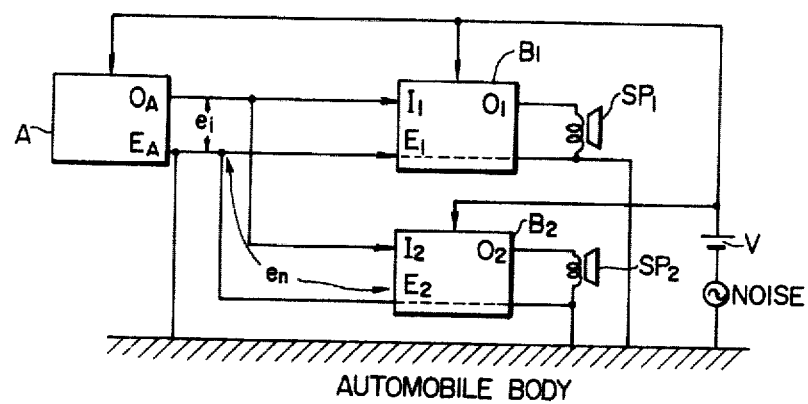
FIG. 1 is a block diagram of an example of the conventional car-mounted multistereo amplifier system.
Figure 2:
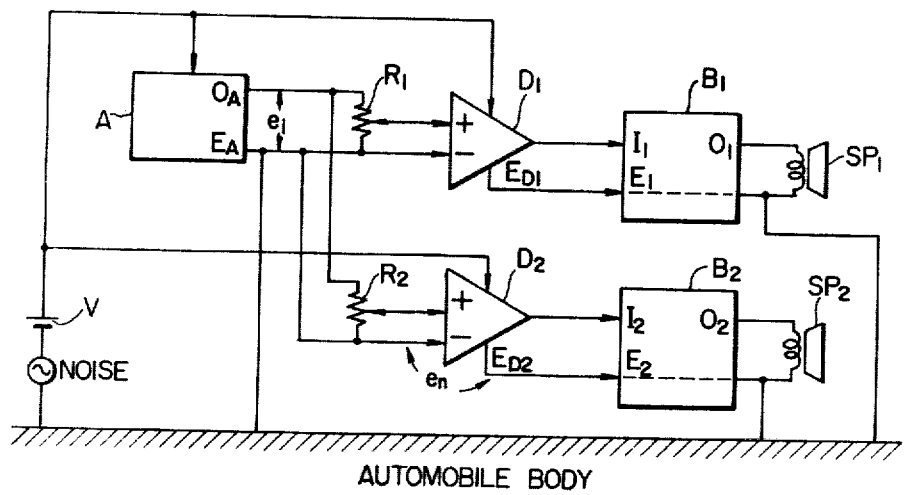
FIG. 2 is a block diagram of another example of the conventional car-mounted multistereo amplifier system.
Figure 3:
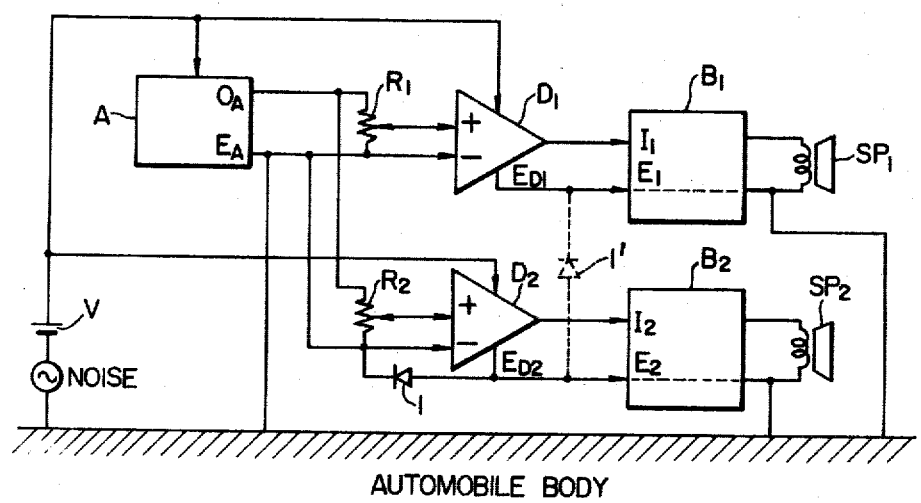
FIG. 3 is a block diagram of an embodiment of the present invention.

In FIG. 3 which is similar to FIG. 2, a diode 1 is connected between the grounding terminal $E_{D2}$ of the differential amplifier $D_2$ and the grounding line $E_A$ of the preamplifier A with an anode of the diode 1 being connected to the terminal $E_{D2}$.

Alternatively, it may be possible to connect a diode 1' between the ground terminal $E_{D2}$ of the differential amplifier $D_2$ and the ground terminal $E_{D1}$ of the differential amplifier $D_1$ with the anode of the diode 1' being connected to the ground terminal $E_{D2}$, as shown by a dotted line.

With either of the diode circuits being added, when the differential amplifier $D_2$ has no load, i.e., the output thereof is in open state, the ground terminal $E_{D2}$ becomes also in open state, i.e., in floating state as mentioned previously with reference to FIG. 2. However, since the positive source voltage V is applied to the position source line, the diode 1 (or 1') is forward-biased through internal circuit elements, so that the potential at the ground terminal $E_{D2}$ becomes nearly equal to the ground potential and, in this case, at a value higher than the ground potential by about 0.6 V which is the forward voltage of the diode. Therefore, the differential amplifier $D_2$ without load can operate ordinarily in a d.c. sense and thus it does not affect other circuits causing no undesirable noise generation.

With the differential amplifiers $D_1$ and $D_2$ with loads, i.e., when the loud speakers $SP_1$ and $SP_2$ are connected through the power amplifiers $B_1$ and $B_2$ to the outputs of the differential amplifiers $D_1$ and $D_2$, respectively, as shown, the ground terminals of the differential amplifiers $D_1$ and $D_2$ and the preamplifier A are at substantially the ground potential in d.c. sense. Therefore, the diode 1' is not in on state and thus the ground line to which the diode is connected becomes in open state. This state corresponds to the circuit in FIG. 2. Thus, the effect of the diode connection on the whole circuit can be negligible. In a.c. sense, the ground terminal circuit becomes equivalent to that without the diode, so long as the a.c. signal level in the ground terminal circuit does not exceed the forward voltage (threshold voltage) of the diode.

In case where the noise level is higher than the forward voltage of the diode, it may be enough to increase the threshold voltage by connecting a plurality of the diodes in series.

In summary, it is enough to provide a biasing means which functions to bias the ground terminal of either of the differential amplifiers which is not used to a potential near the ground potential. The biasing means may comprise the diode etc. which is a switching element having a predetermined threshold voltage, as shown.

In the foregoing description, the multistereo system using two amplifiers has been shown and described. It should be noted however, that the present invention is also applicable to systems using three power amplifiers or more. In such case, a biasing means (or biasing means) is connected between a ground terminal (or ground terminals) of a differential amplifier (or amplifiers) which is used and a ground terminal (or terminals) of another differential amplifier (or amplifiers) which is used. Alternatively, it may be possible to connect a biasing means between the ground terminal of the preamplifier and a differential amplifier which is not used.

According to the present invention, it is possible to substantially completely remove undesired noises of the car-mounted audio equipment with using the very simple circuit construction and thus to provide a good S/N ratio.

What is claimed is:

1. A car-mounted audio equipment of multiamplifier system including a single preamplifier, a plurality of power amplifiers and the corresponding number of differential amplifiers each connected between an output terminal of the preamplifier and an input terminal of each of the power amplifiers, one input terminal of the differential amplifiers being connected to the output terminal of the preamplifier and the other input terminals of the differential amplifiers being connected to a ground terminal of the preamplifier so that respective signals produced between output terminals of the differential amplifiers and the ground terminals thereof are applied to the power amplifiers, comprising a biasing means for biasing at least one of the ground terminals of the power amplifiers to a potential substantially equal to the ground potential when the one terminal is in an open state.

2. A car-mounted audio equipment claimed in claim 1, wherein said biasing means is a switching element provided between the one ground terminal of the differential amplifier and the ground terminal of the preamplifier, said switching element being turned conductive when a voltage between the one ground terminal of the differential amplifier and the ground terminal of the preamplifier exceed a predetermined value.

3. A car-mounted audio equipment claimed in claim 1, wherein said biasing means is a switching element provided between at least one of the ground terminals of the power amplifiers and one of the ground terminals of the remaining power amplifiers, said switching element being turned conductive when a voltage between the one ground terminal of the power amplifier and the one ground terminal of the remaining power amplifier exceed a predetermined value.

* * * * *